United States Patent [19]

Weglin

[11] 4,437,924
[45] Mar. 20, 1984

[54] METHOD OF MAKING FINE-LINE DIE

[75] Inventor: Walter Weglin, Bellevue, Wash.

[73] Assignee: Jerobee Industries, Inc., Redmond, Wash.

[21] Appl. No.: 369,906

[22] Filed: Apr. 19, 1982

[51] Int. Cl.³ .................. C23F 1/02; C03C 15/00; C03C 25/06; B44C 1/22
[52] U.S. Cl. .................. 156/651; 156/661.1; 156/905; 156/515; 430/306
[58] Field of Search .......... 156/650, 651, 656, 659.1, 156/661.1, 905, 251, 515; 430/306, 307, 310; 101/32, 30, 31

[56] References Cited

U.S. PATENT DOCUMENTS

3,758,350  9/1973  Weglin ........................ 156/659.1 X

Primary Examiner—William A. Powell
Attorney, Agent, or Firm—Hughes, Barnard & Cassidy

[57] ABSTRACT

A method for fabricating a precision fine-line die by chemical milling the working face of an etchable workpiece to form a plurality of raised die elements separated and bounded by a plurality of cavities, is comprised of the steps of forming an etchant-resistant surface pattern of boundary grooves penetrating slightly into the working face of the etchable workpiece outwardly proximate and substantially conforming to the configuration of die element precursors, and then selectively etching the workpiece in regions outwardly bounded by the boundary grooves to undercut same and form recessed cavities outwardly proximate and substantially conforming to the complementary configuration of the die element precursors. The step of forming the boundary grooves is preferably a two stage procedure comprised of first chemical milling shallow grooves in the workpiece in the desired pattern and then loading these grooves with an etchant-resistant fill. The region bounded outwardly by adjacent boundary grooves is etched to remove material therefrom, to expose the interface of the fill and to undercut the same, optionally interspersed with periodic steps to remove the fill extending beyond the undercut. The die element precursors are then chemically milled to yield a fine-line and space die.

13 Claims, 20 Drawing Figures

METHOD OF MAKING FINE-LINE DIE

BACKGROUND OF THE INVENTION

1. Field of the Invention

The present invention relates, generally, to methods for fabricating precision dies and, more especially, to methods for chemical milling an etchable workpiece to form a precision stamping or trimming die for fabricating circuit boards where the raised die elements are formed in a highly compressed pattern separated by cavities having a good working depth. The present invention also relates to fine-line dies formed in accordance with these methods.

2. Description of the Background Art

The present inventor's U.S. Pat. Nos. 3,758,350, 4,053,348, and 4,102,735 disclose, inter alia, methods for making precision stamping dies useful in the manufacture of circuit boards, namely printed wiring boards. Briefly stated, the dies disclosed in the those patents include a plurality of raised die elements separated by cavities, which dies are then used to stamp and adhere a metal foil to a prepared substrate bearing a suitable thermoadhesive. The metal foil is pressed against the substrate and severed by the action of the die elements, which are preferably heated, providing an intimate bond between the metal foil within the pattern of the die elements and the substrate while activating the adhesive.

It is important that the die used in the stamping of such circuit boards be formed with precise and sharp die element edges. If the elements are imperfectly formed there is a tendency for an imperfect stamping operation resulting from the lack of a clean cut; e.g., due to dulled edges which can leave behind small ribbons of foil bridging circuit elements to form an undesired connection. In this regard, it is also important that the raised die elements be separated by cavities having a good working depth to insure adequate penetration of the die elements through the foil.

The trend in manufacturing circuit boards is toward miniaturization without a loss of the ability of the board to carry adequate current. Thus, on the one hand designers strive to provide circuit boards with elements closer and closer together while, on the other hand, the demand for improved current ratings requires thicker and thicker foils be used. These two desires on the part of designers are somewhat antagonistic and have taxed conventional chemical milling techniques to a realistic limit. In manufacturing a fine-line knife-edge foil cutting die (i.e., one having a line and space pattern of approximately 0.015" or less), it is difficult to achieve sufficient cavity depth between patterns with conventional chemical milling processes and thereby achieve the goals mentioned above. This results in part because of inherent limitations on photo resist films used to mask portions of the die block during the milling procedure used to form the cavity.

The typical dry film photo resist materials used to mask portions of the face of a die blank, to render those portions etchant passive, are usually films having a thickness on the order of 0.001–0.002". They are typically made from thermoplastic compositions so that the film may be adhered to the metal die blank by the application of heat and pressure. These combined characteristics of heat sensitivity and relatively thin film thickness have proved to be limiting factors in the adaptability of conventional dry film resists in the formation of fine-line dies. For example, when etching a die blank bearing such a thin-film resist, a process typically conducted by disposing the blank in a bath of ferric chloride etchant heated to about 100° F., etchant begins removing material in the etchant-active regions on the die blank (defined between etchant-passive regions bearing photo resist film) and undercuts the photo resist film at the same time. Optimally, the etchant would simply preferentially attack the region bounded by adjacent films; but this is not even a theoretical possibility given the current state of the art. Rather, as the resist film is undercut, the portion extending over the undercut softens due to the temperature of the etchant and flexes due to the activity within the bath. Thus, a weakened line is developed along the interface between the bonded film and the metal substrate supporting same. Softening and flexing allow the formation of a small radius at this bond line, usually one on the order of 0.001–0.002", encouraging increased undercutting and the formation of an undesirably more positive sidewall slope in the cavity being formed. Providing thicker resist films or films made from compositions which are less sensitive to heat are not realistic approaches to the resolution of this significant problem. This is particularly true when one is faced with the task of etching a fine-line die where line and space patterns are less than about 0.015" and where tight pattern areas may have only a few thousands of an inch separation.

While the optimum limitation on open space in a 0.002" dry film resist is about 0.006", there have been attempts to utilize a pattern where spacing is on the order of 0.004" between patterns. However, this requires a labor-intensive and extremely tedious subsequent processing to remove resist "scum" in the tighter pattern areas while the subsequent etching of such patterns produce only about one-half the cavity depth of more open areas. Other efforts have included the use of a 0.001" resist film, but these too have met with limited acceptance; particularly since these thinner resist films undercut faster and provide less cavity depth overall. Further problems are caused because attempts to trim a dry film resist usually result in chipping and a disruption of the bond between resist and metal at the pattern edges due to the brittle nature of the film. This, in turn, leads to ragged chem-milled edges which are highly undesirable.

Consequently, the need exists to provide a method which will allow the fabrication of a die of the character aforesaid where the pattern of die elements is considerably compressed while the surface profile thereof is maintained with a good edge-to-cavity depth relationship.

SUMMARY OF THE INVENTION

The present invention advantageously provides a method which permits the chemical milling of a die to form raised die elements in a much tighter pattern than heretofore available without the unacceptable loss of good cavity depth proximate the raised die elements. The present invention is also desirable for its ability to provide a surface mask on an etchable workpiece, which mask is relatively insensitive to the temperature and physical activity of the bath and thereby less prone to edge flexing. These advantages of the present method may be realized in the chemical milling of most any etchable substrate, thus rendering the instant invention particularly desirable in the fabrication of fine-line knife-edge foil cutting dies used to make circuit boards by a stamping operation.

These and other advantages are realized in accordance with the present invention through a method for fabricating a precision die by chemical milling an etchable workpiece to form a plurality of raised die elements separated and bounded by a plurality of cavities, which method comprises the steps of forming an etchant-resistant surface pattern of boundary grooves penetrating slightly into the working face of the workpiece outwardly proximate and substantially conforming to the configuration of die element precursors, followed by the step of selectively etching the workpiece in regions outwardly bounded by these boundary grooves to undercut them and form recessed cavities outwardly proximate and substantially conforming to the complementary configuration of the die element precursors. The die may then be processed in accordance with established techniques to convert the die element precursors into final die elements to yield a precision die where the die elements have a sharp profile bounded by cavities having good working depth, but in a pattern much tighter or more compressed than heretofore attainable.

In one aspect of the present invention, the boundary grooves are formed by chemically milling shallow grooves in the workpiece in the desired pattern and then loading those grooves with an etchant-resistant fill, such as epoxy. More particularly, the boundary grooves are preferably formed by first preparing composite positive photographic overlay corresponding to the desired pattern of die element precursors, slightly larger than the dimensions of the ultimate die elements to be produced, providing the working face of the workpiece with a photographically-sensitive resist film, exposing the film to sensitizing radiation transmitted through the overlay, and then developing the sensitized film to remove the portion thereof corresponding to the pattern, to yield a negative image on the working face having etchant-active regions in the negative image areas bounded by etchant-passive regions. This workpiece is then chemically milled to provide shallow grooves which are filled with, e.g., epoxy or an equivalent, etchant-resistant filler. The workpiece is subsequently etched in a series of procedures; first where a background cut is made by chemical milling outside the overall pattern area, followed by an intermediate main cut where material from the work face is removed from regions intermediate the boundary grooves, followed by a truing cut to yield die element precursors which are then processed in accordance with established techniques. The main cut is designed to remove selectively the area bounded by adjacent boundary grooves and is comprised of the steps of etching that region to remove material therefrom and expose the interface between the fill and the boundary cavity, optionally interspersed with the steps of periodically removing the fill extending beyond the undercut regions by mechanical means.

Other advantages of the present invention, and a fuller appreciation of the sequence of procedures and resultant dies, will be gained by an examination of the following detailed description of preferred embodiments, taken in conjunction with the figures of drawing, wherein:

BRIEF DESCRIPTION OF THE DRAWINGS

FIG. 1 is an isometric representation of the preferred procedure for preparing a photographic overlay used in the instant method;

DETAILED DESCRIPTION OF THE INVENTION

The present invention relates, generally, to methods for fabricating a precision die by chemical milling techniques and, more especially, to a method for forming a precision fine-line die where the pattern of die elements is in a tight or compressed configuration. The present invention also relates to dies made in accordance with the improved processes disclosed herein. Accordingly, the invention will now be described with reference to certain preferred embodiments within the aforementioned contexts; although those skilled in the art will appreciate that such a description is meant to be exemplary and not limitative.

Prior attempts to fabricate precision dies with tight pattern areas (i.e., those where spacing is less than about 0.006") have not been terribly successful where conventional chemical milling procedures are employed in the fabrication process. When a conventional 0.002" resist film is utilized to provide the protective etchant-resistant overlay on a die blank, pattern spacing down to about 0.004" could be achieved only at the expense of tedious, labor-intensive efforts; for example, it has been necessary to remove resist "scum" by hand operations. And, at that, subsequent chem-milling produced only about one-half the cavity depth achieved in the more open areas. Attempts to alleviate the problem by using a 0.001" resist film were sorely disappointing in an effort to compress the pattern of elements, since this thinner film undercuts at a much faster rate providing less cavity depth overall. Mechanically trimming the resist film is usually not a viable alternative since the same is brittle and usually chips or loosens along or near the trim line which, in turn, causes ragged chem-milling edges which are obviously undesirable.

To achieve sufficient cavity depth for successful operation of a 0.015" line and space die, the chem-milling cycles which define the circuit pattern must produce as much cavity depth as possible. Normally, a positive resist pattern (one similar to the circuit pattern) is developed and configured to be about 0.0045" larger in each dimension than the desired finished circuit element width. However, a cavity depth of only about 0.006" might be expected in the tight areas after the resist film is undercut in the more open areas back to a zero point.

The present invention overcomes many of the problems heretofore experienced in chem-milling a die blank to form a precision die where the die elements are provided in a tight or compressed pattern. In one aspect of the present invention, this advantage is provided by a method for fabricating a precision fine-line die by chemical milling an etchable workpiece, such as a low carbon steel or oil or air hardening tool steel, to form a plurality of raised die elements, such as knife edges, separated and bounded by a plurality of cavities, where the method comprises the step of forming an etchant-resistant surface pattern of boundary grooves penetrating slightly into the working face of the workpiece outwardly proximate and substantially conforming to the configuration of die element precursors which, upon later processing, will become the die elements, followed by a selective etching of the work piece in regions outwardly bounded by the boundary grooves to undercut same and form recessed cavities outwardly proximate and substantially conforming to the complementary configuration of the die element precursors. In the improved process of the present invention, only a single photographic image need be used to establish the pattern of cuts which will yield the finished die element patterns, the photographic pattern being only slightly oversized and comprised of fairly narrow line widths corresponding to the locations of the boundary grooves to be formed in the blank. That is, the step of forming the boundary grooves is comprised itself of the steps of first preparing a composite positive photographic overlay corresponding to the desired pattern of boundary grooves, providing the working face of the die blank with a photographically-sensitive film (i.e., a photo resist), exposing that film to sensitizing radiation transmitted through the overlay, and developing the sensitized film to remove the portion thereof corresponding to the pattern to yield a negative image on the working face having etchant-active regions in the negative image areas bounded by etchant-passive regions. The blank is then exposed to a chem-milling cycle which yields shallow grooves projecting slightly into the working face. Preferably, these shallow grooves will be milled to a depth of from about 0.00075 to about 0.0015", more preferably from about 0.001 to about 0.0015", and most preferably from about 0.00125 to about 0.0015". The grooves are then filled with an etchant-resistant fill such as epoxy which acts as a resist boundary. Subsequently, background cuts are made in the workpiece while the pattern area is protected with a suitable resist film, and then main cuts are made by etching the zones bounded between the boundary grooves. Upon repetitive etching in those zones during the main cutting operation, the boundary grooves themselves will be undercut while permitting substantial cavity depth to be achieved between adjacent die elements. As the boundary grooves are undercut, the fill within the same may optionally be mechanically removed using the undercut line as a guide in order to provide good definition to the finished cavity. Once the boundary grooves are completely undercut, the die blank is then subjected to a truing cut to yield the final, overall configuration of the die; which is then processed to yield the profile desired for the raised die elements, typically knife edge elements.

Figures 1A, 1B, 1C, 1D, 2:
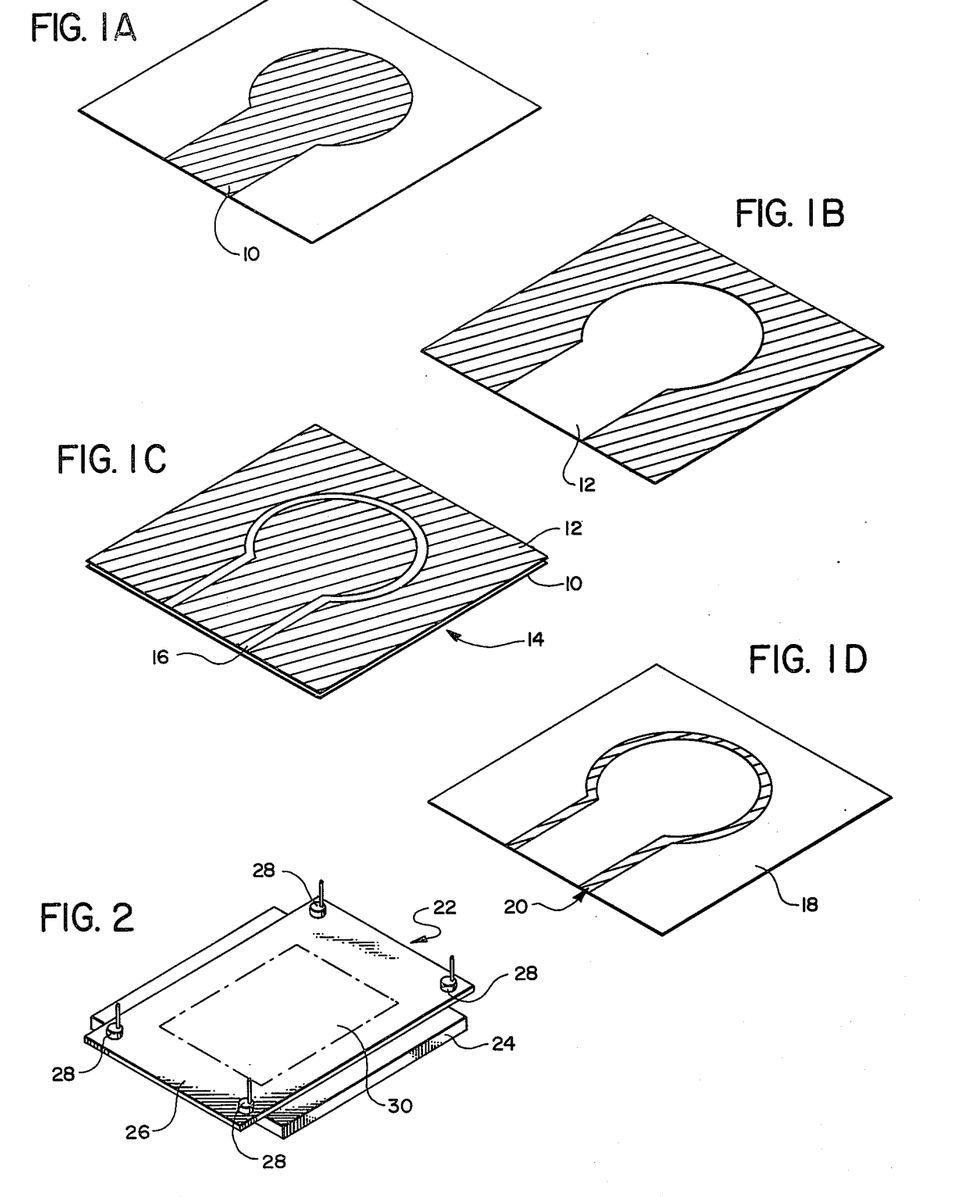
FIG. 2 is an isometric view of an apparatus useful for preparing the overlay of FIG. 1.

Turning to the figures of drawing, in all of which like parts are identified with like reference numerals, FIG. 1 illustrates in four steps, identified FIGS. 1A–1D, the preferred method for producing a composite overlay used to define the pattern of boundary grooves. For the sake of clarity, only one die element is represented in FIG. 1, those skilled in the art being appreciative of the fact that the overlay used for commercial production of a die will include all desired circuit elements.

First, a positive image 10 corresponding to the circuit pattern is prepared where the dimensions of the positive image are slightly oversized (e.g., about 0.001") as compared to the desired elements, as shown in FIG. 1A. [Note, the dimensions recited herein ar representative of those useful in following the procedures of the present method. However, those skilled in the art will recognize that these dimensions can and will vary from one die design to another. Accordingly, all dimensions are given as exemplary, and should not be construed as limitative.] A corresponding negative image 12 is also prepared, but where the dimensions are now increased somewhat (e.g., about 0.0045") as compared with the desired dimensions of the circuit elements, as represented in FIG. 1B. These two images are overlaid, preferably with the positive image beneath the negative image, to form a composite 14, represented in FIG. 1C. Thus, the dimensional differences between the positive pattern 10 and negative pattern 12 will yield a negative trace 16 conforming to an oversized configuration for a desired die element. The composite 14 is then preferably contact printed to yield a composite positive 18 represented in FIG. 1D. The composite positive of FIG. 1D thus includes an outline, designated generally as 20, of each of the die elements to be formed, corresponding to the circuit elements to be produced, where each such element is outlined by a positive image having a width corresponding to the dimensional differences in prints 10 and 12 (e.g., approximately 0.0035" as a result of the exemplified dimensional disparities between the positive and negative images first prepared in FIGS. 1A and 1B, respectively).

Preparation of the composite positive 18 may be achieved in any convenient manner. However, because of the typically small dimensions and importance for maintaining a uniformity of line thickness in the printed boundaries 20, the photographic images 10 and 12 are most preferably made in accordance with the techniques disclosed in the present inventor's U.S. Pat. Nos. 3,758,350, 4,053,348, and 4,102,735. Briefly stated, the positive and negative images 10 and 12 are enlarged from an accurately prepared master by imparting a slight, uniform, wobbling motion to the master vis-a-vis a photographic plate; the amount of "wobble" dictating the amount of desired enlargement (e.g., about 0.001" for the positive 10 and about 0.0045" for the negative 12, using the exemplary dimensions noted above). A device suitable for achieving this controlled wobbling effect to prepare the positive and negative images is shown in FIG. 2.

The assembly of FIG. 2, designated generally as 22, is comprised of a base plate 24 and an upper frame member 26 supported on four rotatable eccentrics 28, one of each being disposed at each corner of the frame. A glass plate negative reproduction 30 is borne on the frame member 26, the photographic image on the reproduction 30 corresponding substantially identically to the desired configuration of the circuit to be stamped by the die ultimately produced. A photographic film is placed on the base plate 24 so that the emulsion on the film is disposed toward the emulsion face of the developed plate 30. Sensitizing radiation is projected from the top, passing through the glass plate negative reproduction 30 onto the film borne on the base plate 24 as the eccentrics 28 are rotated in unison to impart a circular wobbling motion to it while maintaining the same orientation of the frame 26 vis-a-vis the film on base plate 24.

Since the image on the plate 30 is a negative reproduction of the desired art work, the wobbling motion imparted to that image widens the subsequent image to produce a slight enlargement in the image to be developed in the film on plate 24. The exact amount of enlargement may be controlled by selecting eccentrics 28 with a proper radius. Thus, a slightly oversized positive image 10 can be formed within very carefully controlled dimensional limitations (e.g., +1 mil, in accordance with the foregoing exemplary dimensions) and a carefully controlled negative enlargement for the print 12 (e.g., +4.5 mil, following through on the exemplary dimensions given above). For a more detailed description of this procedure, reference is made to the present inventor's aforementioned U.S. patents. Suffice it to say, this preferred technique is one which allows the very accurate reproduction of the images within very carefully controlled enlargement dimensions and, accordingly, yields a very accurate composite positive to be used in the method of the present invention; albeit, other procedures may be adopted by those skilled in the art should they so desire. In any event, the composite positive of the enlarged outline of the elements ultimately to be produced in the die is employed to form a surface pattern of these elements on a prepared die blank.

Figure 3:
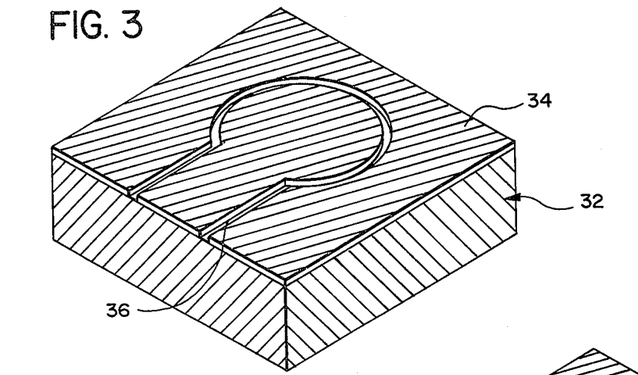
FIG. 3 is an isometric representation of the initial exposure step for impressing an etchant-resistant film in a desired pattern on a workpiece.

A die blank, preferably a low carbon steel or oil or air hardening tool steel, designated generally as 32 in FIG. 3, is provided with a surface of a dry film photo resist 34. Preferably, the resist film 34 is one having a thickness of about 0.001" adhered to the working face of the die blank 32 in a conventional manner. The composite positive 18 is disposed in contact with the resist film 34 and sensitizing radiation is passed through the overlay to expose the film in the normal manner. Upon a subsequent development of the exposed photo resist, a negative pattern, designated generally as 36, is provided in the resist film corresponding to the positive pattern of the lines 20. The resist film 34 is preferably developed with a solvent spray and, when this preferred technique is employed, the actual openings 36 in the resist film will experience some increase in width dimensions because of the inherent undercutting that occurs during spray development of the pattern. Accordingly, while the line widths 20 in the composite positive 18 were exemplified to be of a nominal 0.0035" width, the negative pattern 36 is expected to have line openings on the order of about 0.0045" in width. It is preferred to use the 0.001" dry film photo resist and subject it to the spray development procedure notwithstanding the dimensional increases (which can be accounted for in preparation of the overlay) as opposed to employing a 0.002" dry film resist since the thinner resist will permit a cleaner development of the pattern, normally without requiring any further hand touch-up operations, whereas the thicker 0.002" dry film usually will not reliably wash away to yield a sharp line pattern 36 because of the relatively narrow line widths involved in this aspect of the instant method.

Figure 4:
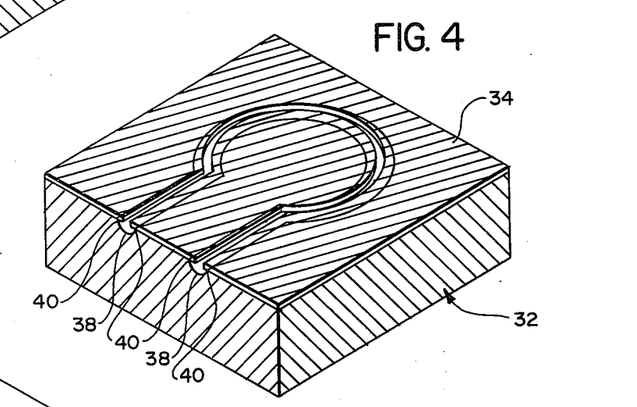
FIG. 4 is an isometric representation of the workpiece of FIG. 3 bearing a photo resist pattern which has been etched to form a boundary groove pattern.
Figure 5:
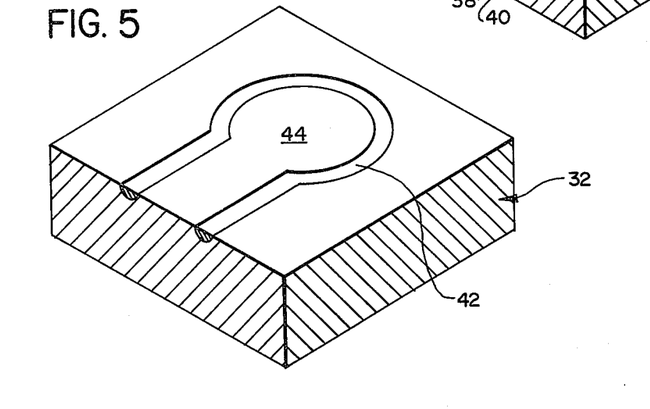
FIG. 5 is an isometric representation of a workpiece having filled boundary grooves.

The steel die blank 32 with the exposed line pattern 36 formed in and removed from the resist film 34 is then subjected to a conventional chemical milling procedure. Typically, the steel blank is etched in a ferric chloride solution and those areas within the line pattern 36 exposed to the etchant, being etchant-active, will be selectively removed. This will result in the formation of shallow grooves 38, best viewed in FIG. 4, undercutting the resist film slightly at 40 in the pattern corresponding to the original positive composite 18. For purposes of illustration, the representative dimensions of the grooves 38 which might be expected at this stage of the procedure will be about 0.0065" in width with a penetration at the deepest point of about 0.00135", following from the exemplary dimensions used herein. After this initial chem-milling cycle, the resist film is removed and the grooved die face is filled with an etchant-active filler, such as epoxy, and the surface is then milled and ground to yield filled boundary grooves designated generally as 42 bounding and conforming to the configuration of a die element precursor 44, best viewed in FIG. 5.

The procedures described thus far in respect of the formation of boundary grooves 42 have as their objective the formation of etchant-resistant "dikes" defining the outer contour of a die element precursor 44. In turn, the die element precursor 44 will subsequently be chem-milled to form a desired die element having raised edges dimensioned and configured to stamp a single circuit element in a later use of the die to fabricate a printed wiring board. Thus, the boundary grooves provide edge isolation of the respective die element precursors during the etching procedure employed to form the cavities separating raised die positions. When the instant process is applied to the fabrication of such circuit stamping dies, there is a highly preferred dimensional relationship between boundary groove width and the zero point or edge of the associated die element, albeit this preferred relationship is not necessary to achieve the benefits of the present invention in its broad aspects.

The exemplary dimensions noted herein result in a boundary groove 42 having a width of about 0.0065" defining the outer contour of die element precursor 44. Most preferably, this width of 0.0065" will encroach slightly, e.g., about 0.0005" into the area of the precursor 44, i.e., +0.006", −0.0005" relative to the zero point thereof. This slight encroachment, as will be seen below, faciliates the placement of resist films used to mask the precursors during the final cutting and truing operations. On the other hand, the die is easily returned to the zero point prior to milling the final die elements from the precursors by a simple surface grinding operation. Certainly, the absolute amount of encroachment can or will vary from one die configuration to another, may depend on the ultimate us to which the die is to be put, and in some situations may be eliminated altogether. Thus, this design option may be readily tailored to meet the needs of a given application.

Figure 6:
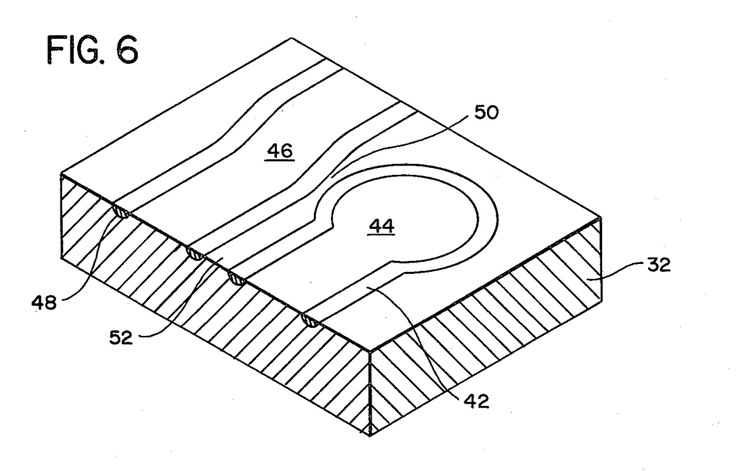
FIG. 6 is a view similar to FIG. 5, showing the placement of adjacent elements on the working face of a die.

FIG. 6 illustrates a die blank having the filled boundary grooves 42 proximate an adjacent circuit element or die element precursor 46 defined between its boundary grooves 48. [As noted above, FIGS. 3-5 illustrate but a single die element for the sake of clarity, it being apparent that the die must include at least two die elements, a second element 46 is now introduced to show the manner in which the die blank 32 is subsequently processed.] The boundary grooves 48 are formed in exactly the same manner as those identified 42 and at the same time by appropriate preparation of the composite positive 18 to include the lines corresponding to these boundary grooves 48. Further for the sake of illustration, the boundary grooves 42 are shown to be separated from the adjacent boundary grooves 48 in the region identified 50 by a lateral dimension on the order of about 0.003", considerably tighter in the pattern configuration than is customarily attempted by using conventional chem-milling techniques. The narrow region 50 merges outwardly toward the end of the die blank into a region designated generally as 52 where the width separation between boundary grooves is represented to be on the order of about 0.008".

Figure 7:
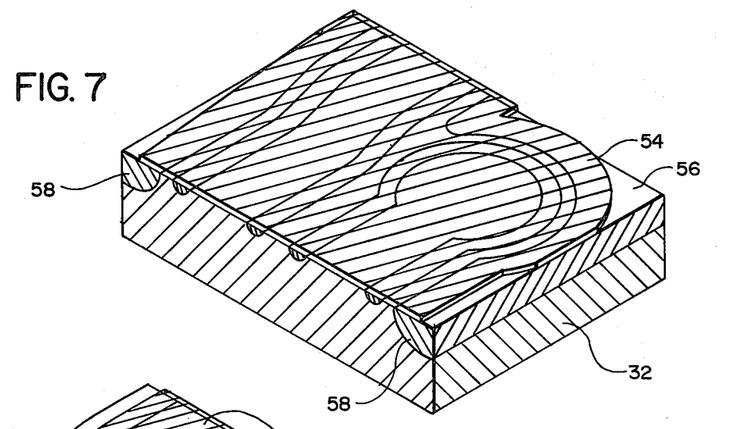
FIG. 7 is an isometric representation of a first background cut of the workpiece shown in FIG. 6.

After the die blank 32 is provided with the boundary grooves in the desired pattern separating the regions corresponding to the die elements to be produced, the blank is selectively etched in a sequence to form die cavities of good working depth. The first milling procedure is a deep cavity or background cut, represented diagrammatically in FIG. 7. The working face of the die blank 32 is shown to be provided with a conventional 0.002" dry film resist, designated generally as 54, extending well beyond the pattern, which is covered by the resist film and is therefore etchant-passive. Preferably, the film 54 is a +32 mil positive image which will protect the pattern area leaving the portion of the working face outwardly proximate same, designated generally as 56, etchant-active. When the blank 32 is then chemically milled by, e.g., etching with ferric chloride, deep cavity cuts 58 will be provided outside the pattern area. Representative dimensions for these deep cavities from the initial background cut are about 0.020" deep with about a 0.010" undercut of the film 54. After completing the deep cavity cut, the dry film resist is preferably removed with a surface grinder in a manner which does not disturb the fill within the boundary grooves.

Figure 8:
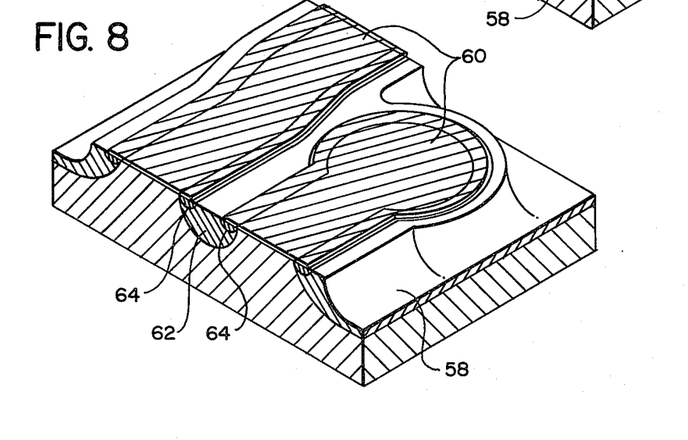
FIG. 8 is an isometric view of the die illustrated in FIG. 7, following a main cut.

The next step to be performed is a main cutting operation, shown diagrammatically in FIG. 8. A new resist pattern, designated generally as 60, is adhered to the working face of the die blank 32. Film 60 is a positive image film of, preferably, a 0.002" dry film resist extending beyond the inner boundaries of the die element precursors 44 and 46. Preferably, the film 60 is about a +4.5 mil positive overlapping the boundary grooves by about 0.005", i.e., +0.0045", -0.0005". The resist film 60 is exposed and developed in the conventional manner and the die is chem-milled until the boundary grooves are completely undercut to yield a cavity 62 between the die element precursors 44 and 46. Concommittantly, the background cavity 58 is further reduced in depth as indicated in FIG. 8. For purposes of illustration, it might be expected that a complete cycle for the formation of cavity 62 will require a total of about 8 minutes of chem-milling which will increase the cavity depth in open areas by about 0.012" and provide cavities in the tight areas having depths of about 0.010".

In some instances, to insure good depth for the cavity 62, the fill within the boundary grooves may be trimmed periodically during the chem-milling procedure. That is, as the cavity 62 is being formed the region 50 between grooves will be preferentially etched away exposing the interface of the fill, designated generally as 64 in FIG. 8, as the undercutting proceeds. Slivers of fill may be removed by "banking" a cutting tool off the edge of the undercut to achieve uniform mechanical removal of the fill. Thus, as the chem-milling continues in the formation of the separating cavity 62, an increase in cavity depth is provided by periodically removing the fill and greater cavity depths in these areas may be achieved thereby.

Figure 9:
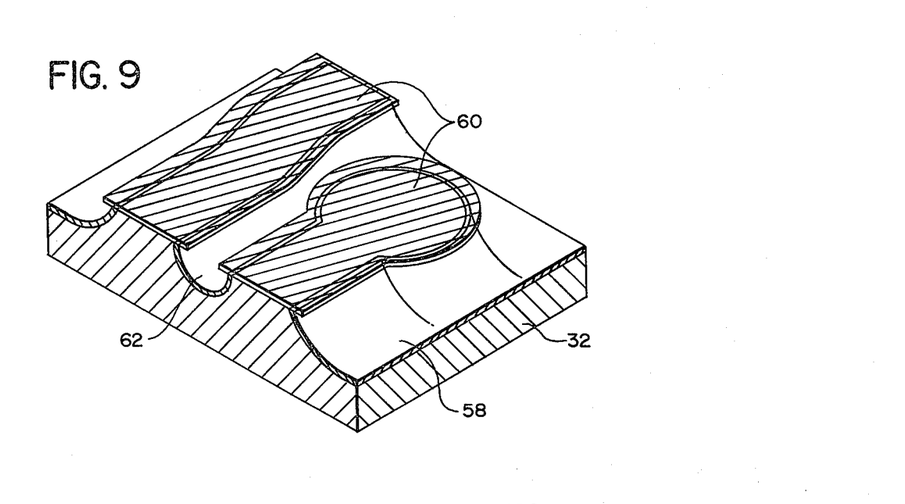
FIG. 9 is an isometric representation of the die shown in FIG. 8, following a truing cut.

The last principal step is a truing cut, illustrated diagrammatically in FIG. 9. The epoxy fill within the boundary grooves is removed and the resist scraped from the working surface of the blank 32 using standard techniques. The final truing cut is preferably achieved with a +1 mil positive image formed in, preferably, a 0.002" dry film resist. Since the +1 positive image will extend slightly beyond the undercut −0.5 edges, alignment of the image to the die can be easily and precisely accomplished. Only about 3 or 4 forty-second chem-milling cycles are typically required to smooth fully and clean properly the sidewall areas. This will normally add about 0.003–0.004" of depth to all cavity areas and yield very closely spaced die element precursor 44 and 46. The resist film is scraped from the die which is then cleaned and ready for subsequent processing to convert the die element precursors into die elements in accordance with, e.g., the processes disclosed and claimed in the present inventor's U.S. Pat. Nos. 3,758,350, 4,053,348, and 4,102,735.

Epoxy is the preferred material used to fill the boundary grooves in practicing the process of the present invention. Other materials might be employed but epoxy remains most preferable for a number of reasons. First, an epoxy inlaid resist can be positioned very close to an adjacent inlaid resist through the use of a 0.001" dry film resist (or liquid resist system). As two adjacent grooves are chem-milled toward each other, the remaining metal might be as narrow as about 0.002" and the die could be processed with little or no difficulty as opposed to the requirement of about 0.006" separation using conventional techniques. And, considerably greater cavity depth is still achieved. Secondly, epoxy adheres to steel better than conventional photo-sensitive resists and the bond is less heat sensitive. The better the bond between the etchant-resistant epoxy and the etchant-active steel substrate, the greater the ratio of depth to undercut and, in turn, the greater cavity depth provided. Third, epoxy can be readily trimmed with a fine blade without undue concern for chipping or loosening of the bond between the epoxy and the steel substrate. After a few etch cycles the undercut sidewall of the groove then can serve as a straight edge against which the fine blade can be "banked" to shave a uniform sliver of epoxy out of these tight areas. This process can be repeated several times so that the, e.g., 0.002" openings end up as trimmed openings of, e.g., 0.006–0.008" with little or no loss of straightness to pattern edges and very little loss of cavity depth in tight areas as compared to open areas. A fourth advantage is realized as the consequence of the fact that an epoxy resist provides more uniform patterns because of its stiffness and resistance to flexing during etch cycles. This minimizes or eliminates chipping of edges which often occurs when employing conventional resists when subjected to prolonged etching cycles. This advantage contributes to uniform undercutting due to better adhesion and also to cleaner sidewalls by allowing more thorough cleaning between etch cycles since there is less concern for damage to the epoxy resist as compared to fragile conventional resists.

Figure 11A:
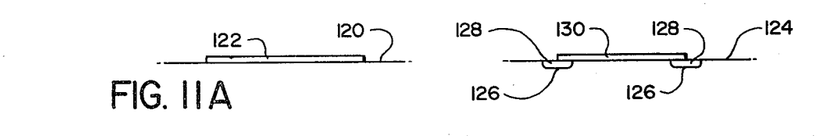
FIG. 11 is a sequential comparison of cross-sectional etching results showing an improved depth-to-undercut relationship where an epoxy inlay is employed as compared with a conventional dry film resist; and, FIG. 12 is a cross-sectional view of a die undergoing etching where an epoxy inlay is included to define die element precursors.
Figure 11B:
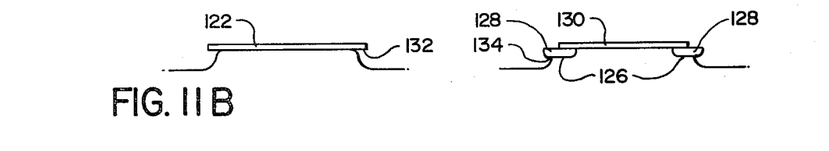
Figure 11C:
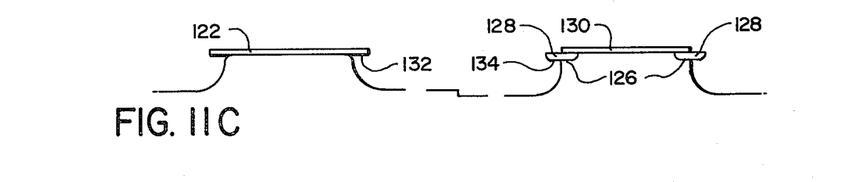
Figure 11D:
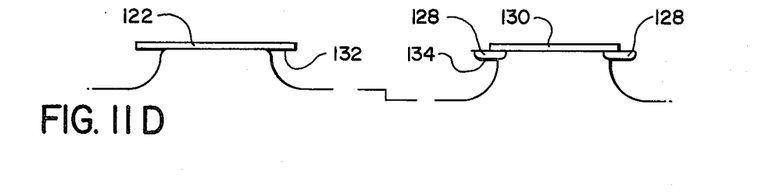
Figure 11E:
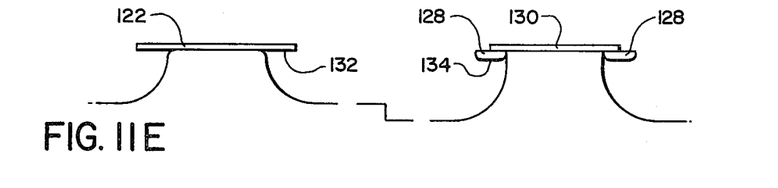
Figure 12:
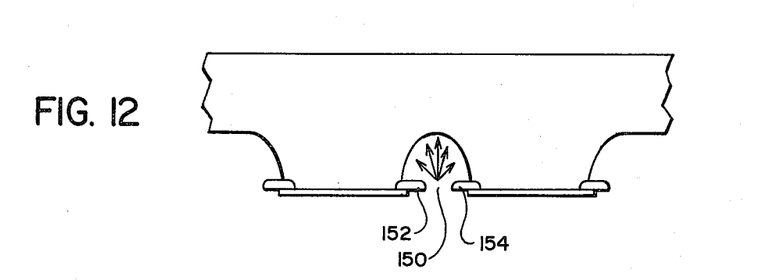

FIGS. 10–12 illustrate comparisons of etching activity for dies using a conventional dry film resist as opposed to an epoxy inlay in accordance with the present invention and a hypothesis for the reason why the epoxy inlay provides these demonstrably improved results.

Figure 10A:
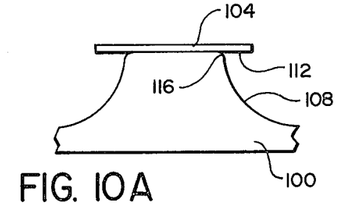
FIG. 10 is a cross-sectional comparison of cavities formed in a metal die block where the block employs either a dry film resist or an epoxy inlay resist.
Figure 10B:
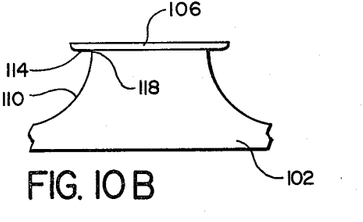

FIG. 10A shows a cross-section of a steel die blank 100 and FIG. 10B shows an identical die blank 102. The die blank 100 has adhered to it a conventional dry film resist 104 whereas the blank 102 has an epoxy resist 106. The two die blanks 100 and 102 were etched to yield die cavities 108 and 110, respectively, both having the same cavity depth. However, upon inspection it was learned that the undercut area 112 beneath the dry film resist 104 was approximately 40% greater than the undercut area 114 beneath the epoxy inlay 106. Furthermore, the juncture of the cavity 108 and the film 104, designated generally as 116, was found to be rounded, with a small radius on the order of about 0.001–0.002". To the contrary, the corresponding juncture 118 on the die 102 was very sharp.

FIG. 11 shows progressively, from FIG. 11A through FIG. 11E, the step-wise progression of a chemical milling sequence performed on a steel workpiece having a conventional dry film resist as compared with one having an epoxy inlay.

FIG. 11A shows the surface 120 of a steel die blank having a dry film resist 122 applied thereto in the customary manner. The dry film resist is one having an approximate thickness of about 0.002". A similar die blank having a surface 124 is prepared by first chemmilling grooves 126 and then filling those grooves with epoxy 128 to form inlays in accordance with the techniques set forth above. A dry film resist 130 is applied over the surface 124 partially overlapping the inlays 128. The two die blanks are then subjected to a normal chemical milling procedure, using ferric chloride etchant at about 100° F. The chem-milling is controlled so that each of the surfaces 120 and 124 is undercut to the same extent beneath the resist film 122 and epoxy inlay 128, respectively. The results are shown in FIG. 11B, where the undercut regions 132 and 134 are both approximately 0.002". Inspection also shows that the juncture between the dry film resist 122 and the undercut cavity 132 is slightly rounded. It is further observed that the cavity depths are substantially the same at this stage.

The two blanks are then returned to etchant baths until about 0.004" of undercut has been achieved for each cavity 132 and 134. These results are shown in FIG. 11C, which further illustrates a slightly greater depth for cavity 134 as opposed to cavity 132. This increase is about 0.001". The juncture between the cavity 132 and the film 122 is noted to be somewhat more rounded while the corresponding juncture at the epoxy inlay is noted to remain rather sharp.

The two blanks are then returned to the bath again until each is undercut approximately 0.006". The dies are compared, as shown in FIG. 11D. Cavity depth for cavity 134 is now about 0.002" deeper than that for 132 notwithstanding the same amount of undercut. Further rounding is observed where the cavity meets the dry film resist 122 whereas the cavity edge for 134 remains rather sharp.

The two dies are again returned to etchant baths and etching allowed to proceed until each undercut dimension is about 0.008". The two dies are compared and, as shown in FIG. 11E, the cavity depth for the cavity 134 is now about 0.018" as opposed to about 0.014" for the cavity 132. Also, the objectionable rounding of the juncture at the dry film resist is not observed at the juncture with the epoxy inlay. The slope of the sidewalls for cavity 134 is much better defined which, along with the greater cavity depth achieved, will ultimately provide a much better die when the final chem-milling of knife edges is accomplished.

In sum, the use of an epoxy inlay as opposed to a conventional resist film vastly improves both cavity depth and slope definition as compared with conventional photoresist films.

FIG. 12 shows schematically a hypothesis for the improved results observed by practicing the present invention. While not wishing to be bound by any particular theory of operation, it is believed that the active region lying between two epoxy inlays etches deeper because of the improved adhesion between the epoxy inlay and the metal substrate as well as the greater stiffness and lesser heat sensitivity of epoxy as opposed to a dry film resist. As the etchant enters the cavity region, denoted generally as 150, bounded by opposing inlays 152 and 154, greatest activity is achieved at the peak of the cavity with considerably lesser activity near the sidewalls thereof. As etchant circulates, it preferentially attacks the peak of the cavity as opposed to the sidewalls which are guarded or partially blocked by the extensions of the inlaid epoxy elements 152 and 154, as indicated graphically by the representative vectors within the cavity 150. In other words, since the rigid epoxy does not flex like thermoplastic dry film resists causing etchant to reverse direction as runoff to attack the inside radius, the flow of etchant in the direction of undercut is relatively minimal thereby providing additional depth per unit of undercut. Accordingly, more etchant activity is concentrated within the depth of the cavity as opposed to the sidewall areas which, in turn, contributes to the improved results shown herein.

While the invention has now been described with reference to certain preferred embodiments thereof, and in terms of illustrative dimensions, those skilled in the art will appreciate that various substitutions, omissions, changes, and modifications may be made without departing from the spirit thereof. Accordingly, it is intended that the scope of the invention be limited solely by that of the claims granted herein.

What is claimed is:

1. A method for fabricating a precision die by chemical milling the working face of an etchable workpiece form a plurality of raised die elements separated and bounded by a plurality of cavities, said method comprising the steps of:
   a. forming an etchant-resistant surface pattern of boundary grooves penetrating slightly into the working face of an etchable workpiece outwardly proximate and substantially conforming to a desired configuration for die element precursors; and,
   b. selectively etching said workpiece in regions outwardly bounded by said boundary grooves to undercut said grooves and form recessed cavities outwardly proximate and substantially conforming to the complementary configuration of said die element precursors.

2. The method of claim 1, wherein said step of forming said boundary grooves is comprised of the steps of:
   a. chemical milling shallow grooves in said workpiece in said pattern; and, b. loading said grooves with an etchant-resistant fill.

3. The method of claim 1, wherein said step of forming said boundary grooves is comprised of the steps of:
 a. providing the working face of said workpiece with a protective overlay of an etchant-resistant film having a negative pattern corresponding to the positions of said boundary grooves whereby said working face is etchant active within the contours of said pattern; and,
 b. etching said working face to form shallow grooves therein in the pattern of said boundary grooves.

4. The method of claim 3, further comprising the step of loading said shallow grooves with an etchant-resistant filler.

5. The method of claim 4, wherein said filler is an epoxy filler.

6. The method of claims 2 or 3, wherein said step of forming said boundary grooves is further comprised of the steps of:
 a. preparing a positive photographic overlay corresponding to said pattern;
 b. providing said working face with a photographically-sensitive film;
 c. exposing said film to sensitizing radiation transmitted through said overlay; and,
 d. developing the sensitized film to remove the portion thereof corresponding to said pattern to yield a negative image on said working face having etchant-active regions in said negative image areas bounded by etchant-passive regions.

7. The method of claim 2, wherein said step of selectively etching said workpiece to undercut said grooves is comprised of the steps of:
 a. repetitively etching the region between and bounded by said boundary grooves to remove material therefrom and expose the interface of said fill;
 b. periodically mechanically removing the fill extending beyond the undercut.

8. A method for fabricating a precision die by chemical milling an etchable workpiece to form plurality of raised die elements separated and bounded by a plurality of cavities, said method comprising the steps of:
 a. preparing a composite positive photographic overlay bearing a thickened line pattern conforming substantially to the boundaries of a desired configuration of die elements;
 b. providing an etchable workpiece with a surface film of a photo resist composition;
 c. exposing said photo resist to sensitizing radiation through said overlay;
 d. developing the exposed photo resist to yield a negative pattern conforming substantially to the boundaries of said configuration of die elements whereby the portion of the surface of said workpiece within the image area of said negative pattern is etchant active;
 e. etching said workpiece to form shallow grooves in the surface thereof conforming substantially to the boundaries of said configuration;
 f. loading said shallow grooves with an etchant-resistant fill to yield an etchant-resistant surface pattern of boundary grooves penetrating slightly into the working face of said workpiece outwardly proximate and conforming substantially to said configuration;
 g. selectively etching the regions outwardly bounded by said boundary grooves to undercut said grooves and form recessed cavities in said workpiece outwardly proximate and substantially conforming to the complementary configuration of the outer boundaries of said die elements.

9. The method of claim 8, wherein said step of preparing said photographic overlay comprises the steps of:
 a. preparing a positive image of a desired die configuration wherein the positive image dimensions are oversized by a predetermined first enlargement dimension;
 b. preparing a negative image of said desired die configuration wherein the negative image dimensions are oversized by a predetermined second enlargement dimension and further wherein said second enlargement dimension is greater than said first enlargement dimension; and,
 c. preparing a composite positive boundary image having a thickened line pattern conforming substantially to the boundaries of die elements defining said configuration by photographically mating said positive and negative images, wherein said thickened line pattern has a line width dimension substantially equal to the dimensional difference between said first and second enlargement dimensions.

10. In a chemical milling method for removing selected regions from the surface of an etchable substrate having etchant-passive regions defined by a surface pattern of an etchant-resistant film bounded by etchant-active regions defined intermediate the edges of said film, the improvement comprising the step of forming an etchant-resistant surface pattern of boundary grooves penetrating slightly into said substrate having a filler supporting said edges.

11. The method of claim 10, wherein said step of forming said boundary grooves is comprised of the steps of:
 a. preparing a narrow line representation substantially conforming to the line pattern of said boundary grooves;
 b. photographically replicating said narrow line representation as a positive image wherein the width of said line pattern is enlarged by a first, predetermined dimension;
 c. photographically replicating said narrow line representation as a negative image wherein the width of said line pattern is enlarged by a second, predetermined dimension larger than said first;
 d. registering the replications of steps (b) and (c) to yield a composite;
 e. contact printing said composite to yield a positive photographic pattern image conforming to said line pattern wherein the width of the lines comprising said positive photographic pattern image is enlarged by an amount corresponding substantially to the difference between said first and said second predetermined dimensions;
 f. exposing a surface coating of a photoresist film borne upon said substrate to sensitizing radiation through said positive photographic pattern image and developing the sensitized photoresist film to yield an etchant-active pattern on said substrate conforming to an enlarged line-width pattern for said boundary grooves;
 g. etching said substrate to remove selectively those areas within said enlarged line-width pattern and thereby yield surface grooves penetrating slightly within said surface; and, h. filling said surface grooves with an etchant-resistant filler to yield said etchant resistant boundary grooves.

12. The method of claim 11, further comprising the steps of:
   a. providing said substrate with a photo resist film in a pattern partially overlapping the width of said boundary grooves whereby the edges of said photo resist film are supported thereon; and,
   b. etching said substrate in the regions bounded by said boundary grooves to form recessed cavities therein.

13. The method of claim 12 wherein etching step for forming said cavities is comprised of the steps of intermittently etching said substrate and mechanically removing any fill extending within the region of said cavities.

* * * * *